(12) United States Patent
Chen et al.

(10) Patent No.: US 11,064,807 B2
(45) Date of Patent: Jul. 20, 2021

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Kai-Wen You, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 138 days.

(21) Appl. No.: 16/562,551

(22) Filed: Sep. 6, 2019

(65) Prior Publication Data
US 2020/0337462 A1 Oct. 29, 2020

(30) Foreign Application Priority Data
Apr. 23, 2019 (TW) ................ 108114401

(51) Int. Cl.
*A47B 88/49* (2017.01)
*H05K 7/14* (2006.01)
*A47B 96/06* (2006.01)

(52) U.S. Cl.
CPC ............. *A47B 88/49* (2017.01); *A47B 96/06* (2013.01); *H05K 7/1489* (2013.01)

(58) Field of Classification Search
CPC . A47B 88/40; A47B 88/49; A47B 2210/0016; A47B 2210/0018; A47B 2210/0056; A47B 96/06; A47B 88/70; A47B 88/443; H05K 7/1489; H05K 7/183; H05K 7/1487; H05K 7/14
USPC ........ 312/333, 334.7, 334.8, 334.44, 334.46, 312/334.47, 334.24, 334.28
See application file for complete search history.

(56) References Cited

U.S. PATENT DOCUMENTS

| | | | | |
|---|---|---|---|---|
| 4,025,138 A | * | 5/1977 | Kittle ................... | A47B 88/493 384/18 |
| 4,988,214 A | * | 1/1991 | Clement .............. | A47B 88/493 312/333 |
| 6,244,679 B1 | * | 6/2001 | Robertson ............ | A47B 88/493 29/505 |
| 6,685,033 B1 | * | 2/2004 | Baddour ................ | G06F 1/183 211/26 |
| 9,237,671 B2 | | 1/2016 | Chen et al. | |
| 9,572,277 B2 | | 2/2017 | Chen et al. | |
| 10,499,738 B2 | * | 12/2019 | Chen ....................... | F16C 29/04 |
| 10,888,157 B2 | * | 1/2021 | Koenig ................ | A47B 88/493 |

(Continued)

FOREIGN PATENT DOCUMENTS

DE 102016216904 A1 * 3/2018 ........... A47B 88/493

*Primary Examiner* — Hiwot E Tefera
(74) *Attorney, Agent, or Firm* — Rosenberg, Klein & Lee

(57) ABSTRACT

A slide rail assembly includes a first rail, a second rail, a first support rail, a second support rail, a third rail, and a third support rail. The second rail is displaceable with respect to the first rail. The first support rail is fixedly connected to a first portion of the second rail. The second support rail is movably connected to a second portion of the second rail. The third rail is fixedly connected to the second support rail. The third support rail is displaceable with respect to the third rail.

14 Claims, 17 Drawing Sheets

(56) References Cited

U.S. PATENT DOCUMENTS

| | | | |
|---|---|---|---|
| 2014/0265788 A1* | 9/2014 | Judge | H05K 7/1489 312/334.1 |
| 2015/0201522 A1* | 7/2015 | Jau | H05K 7/1488 312/330.1 |
| 2015/0208543 A1* | 7/2015 | Chen | G06F 1/184 361/679.39 |
| 2016/0227666 A1* | 8/2016 | Chen | H05K 7/183 |
| 2016/0262538 A1* | 9/2016 | Chen | A47B 96/025 |
| 2017/0205857 A1* | 7/2017 | Moore | G11B 33/005 |
| 2018/0073559 A1* | 3/2018 | Chen | H05K 7/1489 |

* cited by examiner

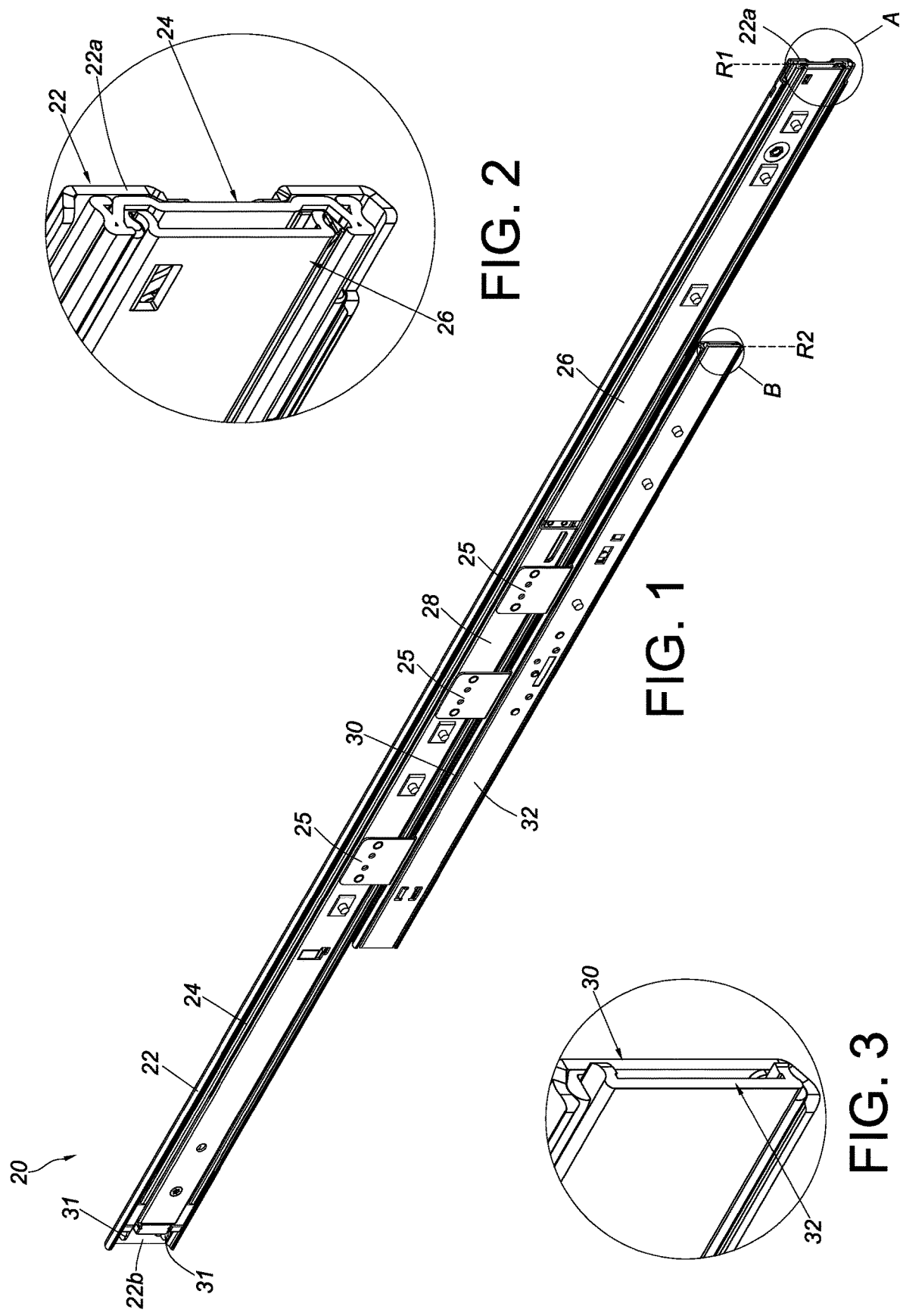

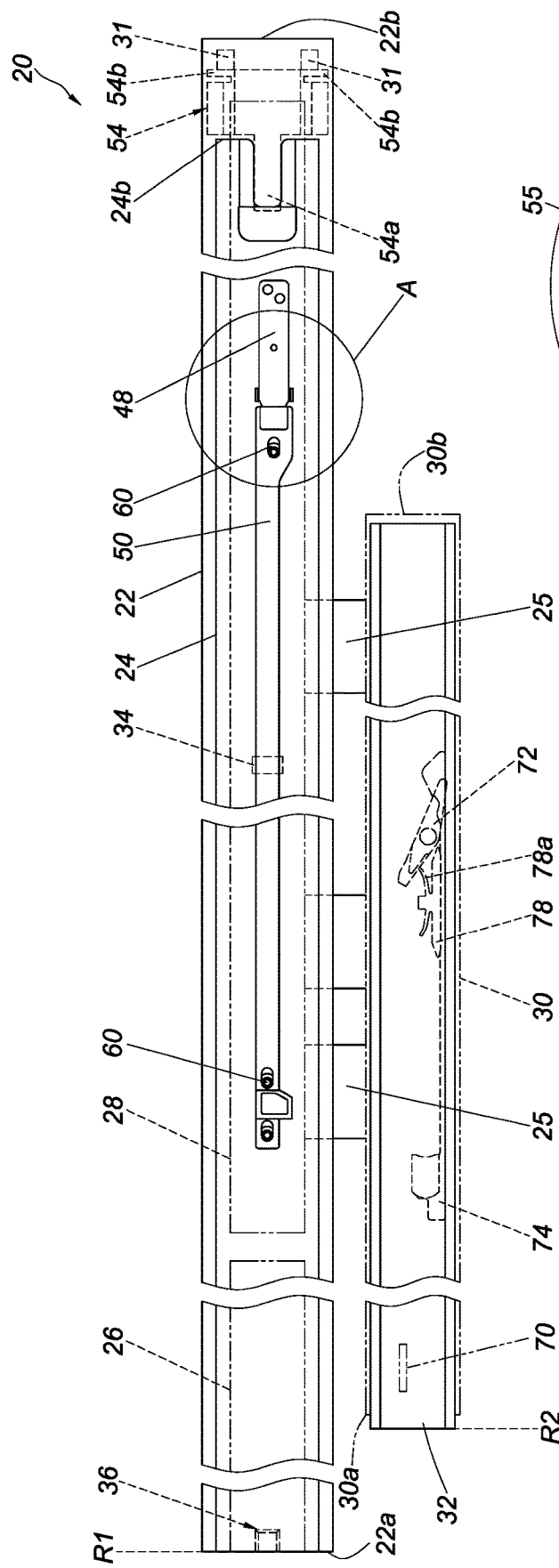
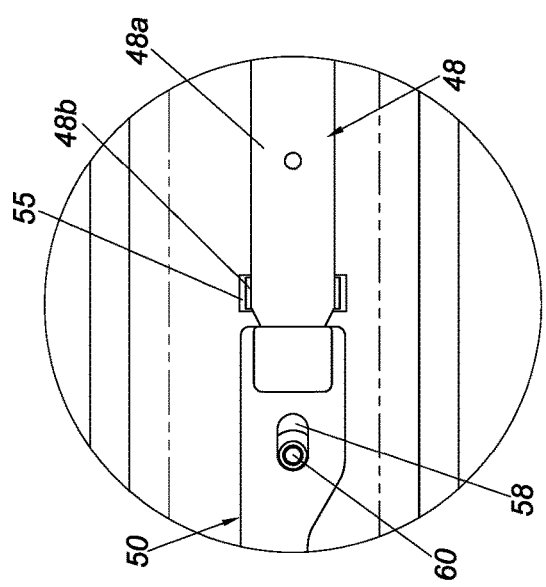
FIG. 10
FIG. 11

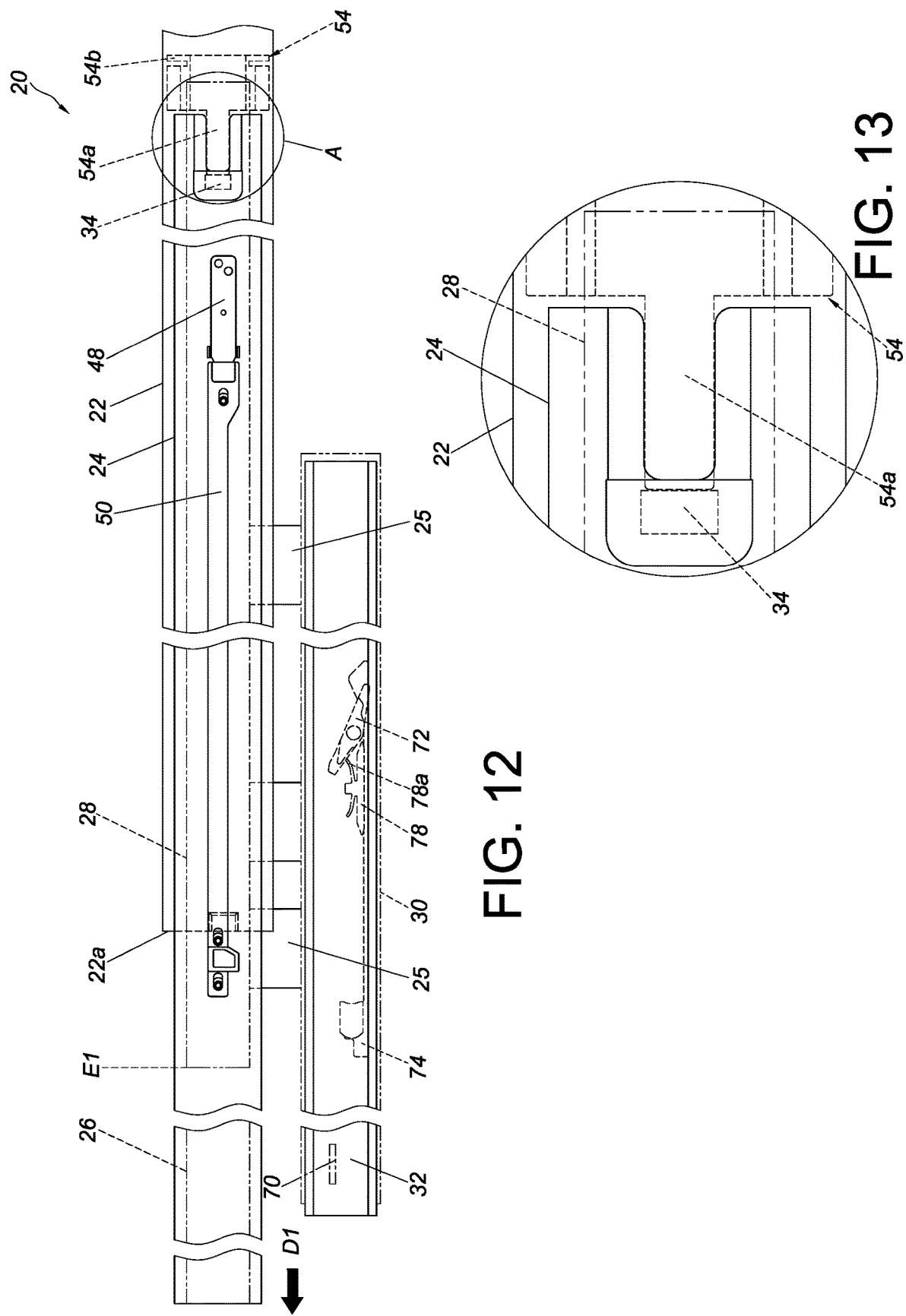

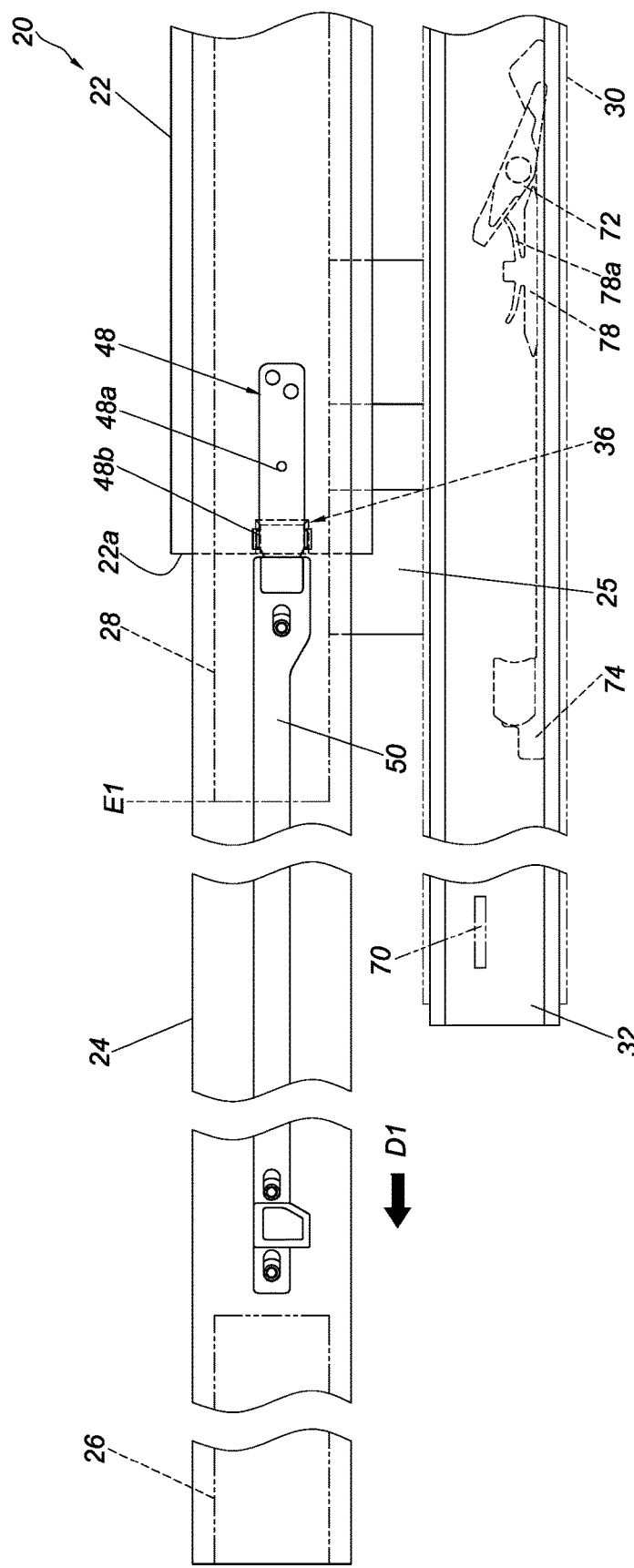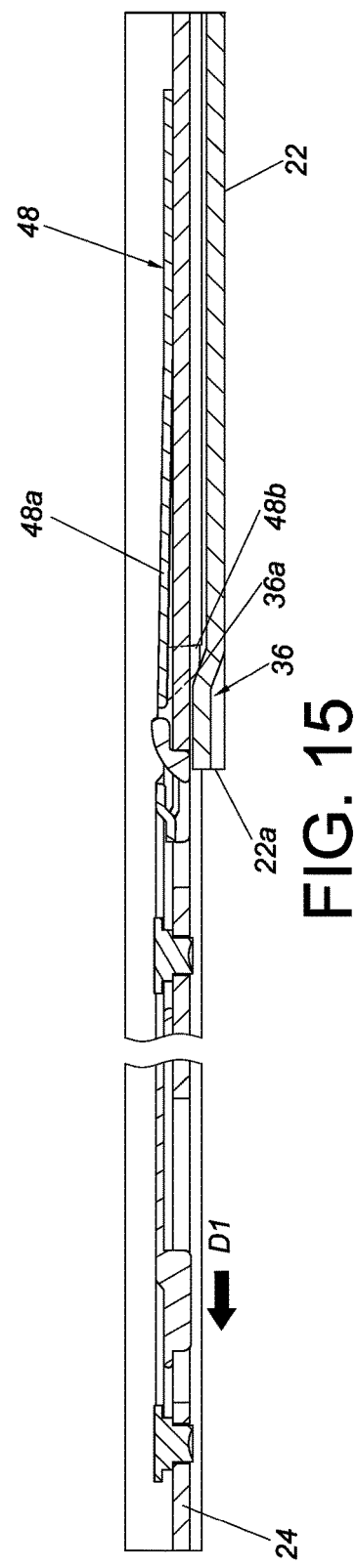

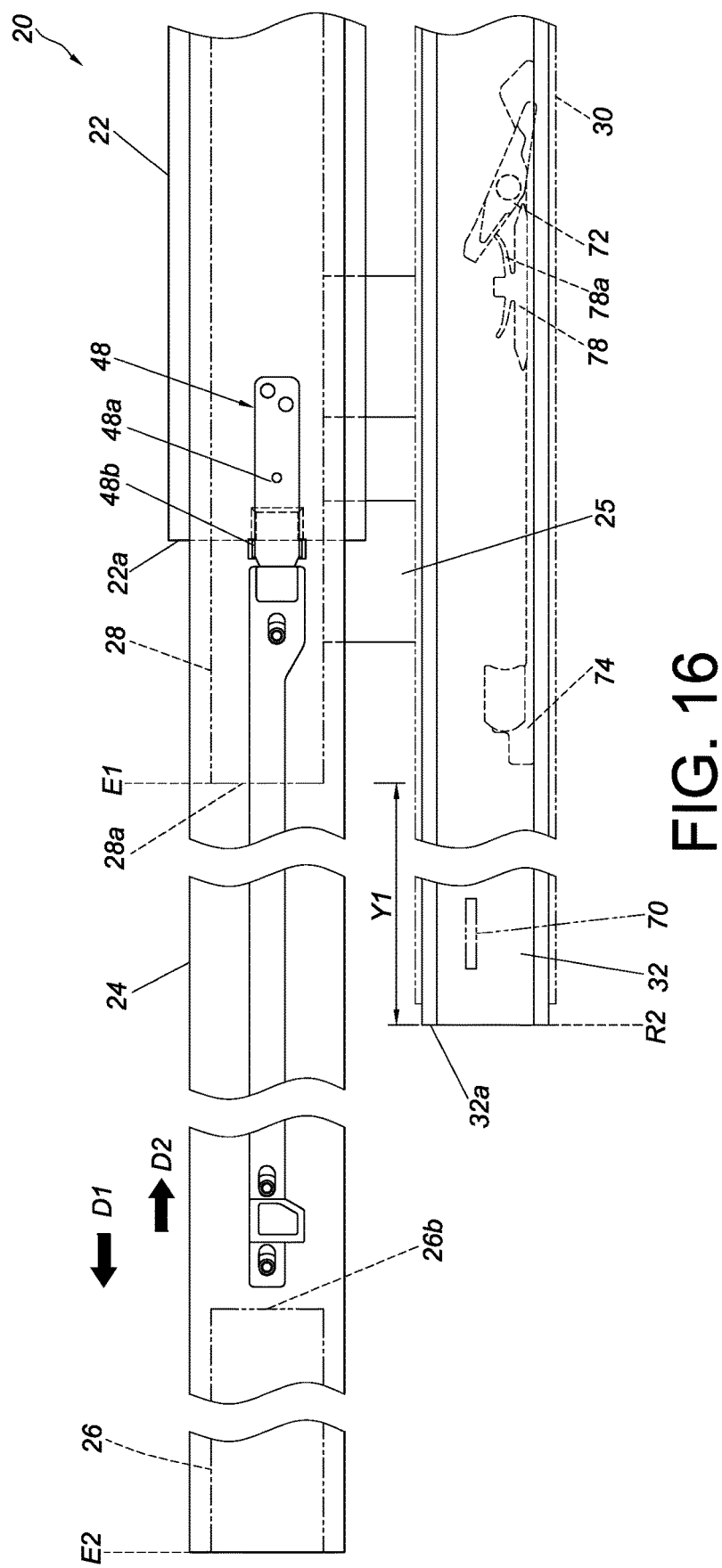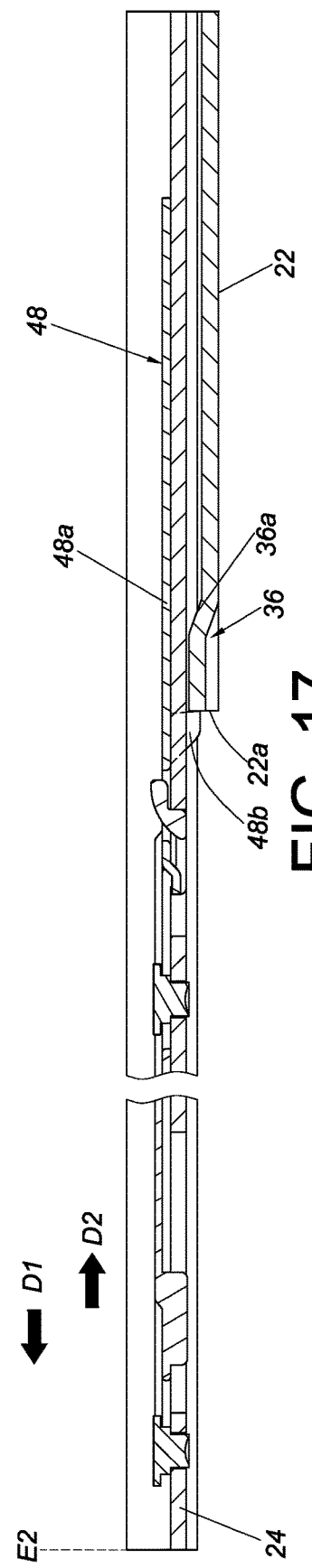
FIG. 16
FIG. 17

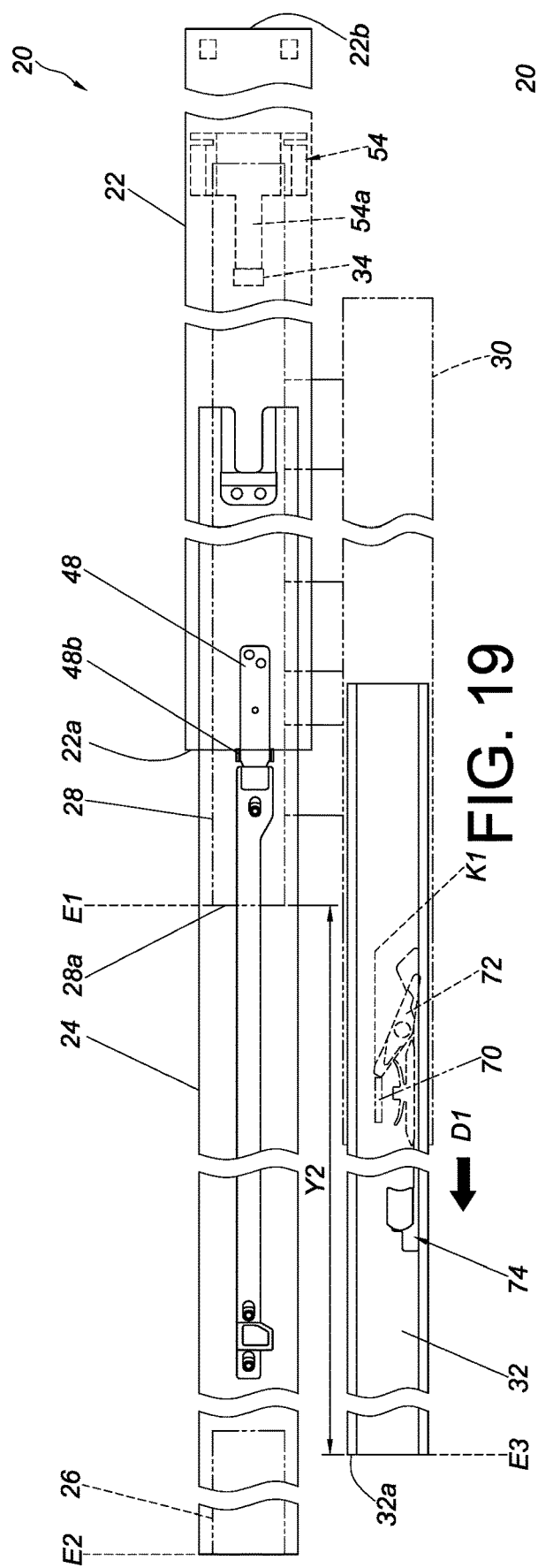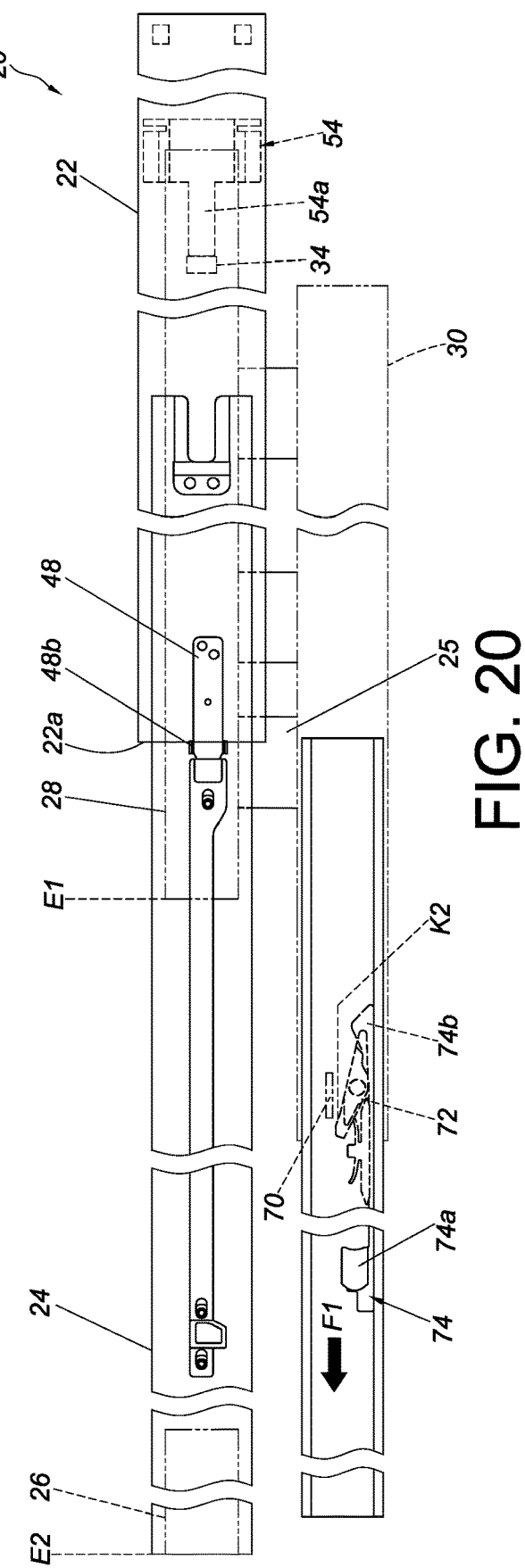

SLIDE RAIL ASSEMBLY

FIELD OF THE INVENTION

The present invention relates to a slide rail and more particularly to a slide rail assembly configured to carry a plurality of objects mounted thereon and to enable multistage opening.

BACKGROUND OF THE INVENTION

U.S. Pat. No. 9,572,277 B2 discloses a slide rail assembly that includes a first rail, a second rail, a third rail, and an extension rail. The second rail can be longitudinally displaced with respect to the first rail. The third rail is movably connected to a first section of the second rail. The extension rail is fixedly mounted on a second section of the second rail. The third rail can be mounted with a first chassis, and the extension rail can be mounted with a second chassis.

As market demands vary, it is worthwhile to develop slide rail products different from the above.

SUMMARY OF THE INVENTION

The present invention provides a structurally innovative slide rail assembly that enables multistage opening.

According to one aspect of the present invention, a slide rail assembly includes a first rail, a second rail, a first support rail, a second support rail, a third rail, and a third support rail. The second rail is movably connected to the first rail and has a first portion and a second portion. The first support rail is fixedly connected to the first portion of the second rail. The second support rail is movably connected to the second portion of the second rail. The third rail is fixedly connected to the second support rail. The third support rail is movably connected to the third rail.

Preferably, the first rail is provided with a limiting feature between the front and rear ends of the first rail, and the second support rail is provided with a corresponding feature. When the second rail reaches a first extended position after being displaced with respect to the first rail from a first retracted position in an opening direction, the second support rail abuts against the limiting feature through the corresponding feature and is thus kept at the first extended position with respect to the first rail.

Preferably, when the second rail reaches a second extended position after being displaced from the first extended position in the opening direction, there is a predetermined distance between the rear end of the first support rail and the front end of the second support rail.

Preferably, the slide rail assembly further includes an engaging member disposed on the second rail. The second rail is engaged with the first rail through the engaging member when at the second extended position with respect to the first rail and is thus kept from being displaced from the second extended position in a retracting direction.

Preferably, the slide rail assembly further includes an operating member disposed on the second rail. The operating member is configured to drive the engaging member out of engagement with the first rail so that the second rail can be displaced from the second extended position in the retracting direction.

Preferably, the front end of the third support rail extends beyond the front end of the second support rail by a first extension distance when the second support rail is kept at the first extended position and the third support rail is at a second retracted position with respect to the third rail.

Preferably, the front end of the third support rail extends beyond the front end of the second support rail by a second extension distance when the second support rail is kept at the first extended position and the third support rail reaches a third extended position after being displaced with respect to the third rail from the second retracted position in the opening direction, wherein the second extension distance is greater than the first extension distance.

Preferably, the third rail includes a blocking portion, and a working member is movably disposed on the third support rail. When the third support rail is at the third extended position with respect to the third rail, the working member is in a first state and abuts against the blocking portion to prevent the third support rail from being displaced from the third extended position in the opening direction.

Preferably, the working member can be operated and thus brought from the first state into a second state, in which the working member no longer abuts against the blocking portion and therefore allows the third support rail to be displaced from the third extended position in the opening direction in order to be detached from the third rail.

Preferably, the second support rail and the third rail are connected by at least one connecting member. The connecting member includes a first portion, a second portion, and a middle portion connected between the first portion and the second portion. The first portion and the second portion are substantially perpendicularly connected to the middle portion and extend in different directions respectively. The first portion is fixedly connected to the second support rail while the second portion is fixedly connected to the third rail.

Preferably, the slide rail assembly can be used to carry a first object, a second object, and a third object, wherein the first object, the second object, and the third object are disposed on the first support rail, the second support rail, and the third support rail respectively. When the second rail is at the second extended position and the third support rail is at the second retracted position, the whole first support rail lies ahead of the front end of the first rail, and a first space is defined between the first object and the third object.

Preferably, when the second rail is at the second extended position and the third support rail is at the third extended position, the whole third support rail lies ahead of the front end of the first rail, and a second space is defined between the third object and the second object.

According to another aspect of the present invention, a slide rail assembly includes a first rail, a second rail, a first support rail, a second support rail, a third rail, a connecting member, and a third support rail. The second rail can be longitudinally displaced with respect to the first rail. The first support rail is fixedly connected to a front section of the second rail. The second support rail is movably connected to a rear section of the second rail. The connecting member connects the second support rail and the third rail. The third support rail can be longitudinally displaced with respect to the third rail.

BRIEF DESCRIPTION OF THE DRAWINGS

FIG. 1 is a perspective view of the slide rail assembly according to an embodiment of the present invention, wherein the slide rail assembly is in a retracted state;

FIG. 2 is an enlarged view of the circled area A in FIG. 1;

FIG. 3 is an enlarged view of the circled area B in FIG. 1;

FIG. 10 is a schematic view showing the slide rail assembly in the retracted state according to the embodiment of the present invention;

FIG. 11 is an enlarged view of the circled area A in FIG. 10;

FIG. 12 is a schematic view showing the first slide rail device of the slide rail assembly in a first extended state while the second slide rail device remains in the retracted state;

FIG. 13 is an enlarged view of the circled area A in FIG. 12;

FIG. 14 is a schematic view showing that the second rail in the first slide rail device of the slide rail assembly is moved in an opening direction from the first extended state while the second slide rail device remains in the retracted state according to the embodiment of the present invention;

FIG. 15 is another schematic view showing that the second rail in the first slide rail device of the slide rail assembly is moved in an opening direction from the first extended state according to the embodiment of the present invention;

FIG. 16 is a schematic view showing that the first slide rail device of the slide rail assembly enters a second extended state while the second slide rail device remains in the retracted state according to the embodiment of the present invention;

FIG. 17 is a schematic view showing how the engaging member engages with the first rail to bring the first slide rail device of the slide rail assembly into the second extended state according to the embodiment of the present invention;

FIG. 19 is a schematic view showing the slide rail assembly in the extended state according to the embodiment of the present invention;

FIG. 20 is another schematic view showing the slide rail assembly in the extended state according to the embodiment of the present invention, wherein the third support rail can now be separated from the third rail in the opening direction;

DETAILED DESCRIPTION OF THE INVENTION

Figure 4:
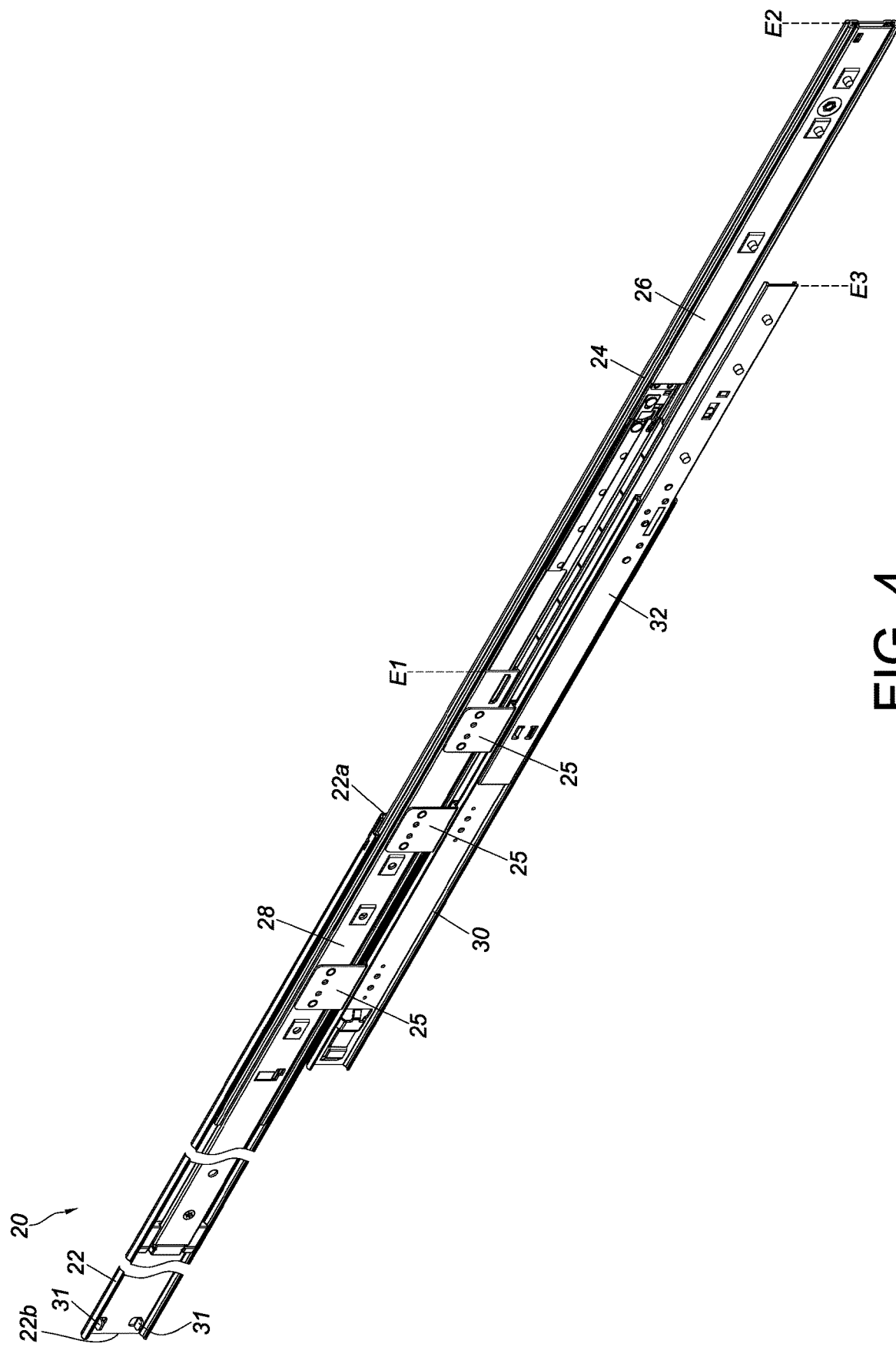
FIG. 4 is another perspective view of the slide rail assembly according to the embodiment of the present invention, wherein the slide rail assembly is in an extended state.

Referring to FIG. 1, FIG. 2, and FIG. 3, the slide rail assembly 20 according to an embodiment of the present invention includes a first rail 22, a second rail 24, a first support rail 26, a second support rail 28, a third rail 30, and a third support rail 32.

The second rail 24 can be longitudinally displaced with respect to the first rail 22. The first support rail 26 is fixedly connected to a first portion of the second rail 24 while the second support rail 28 is movably connected to a second portion of the second rail 24. The first rail 22, the second rail 24, the first support rail 26, and the second support rail 28 jointly form a first slide rail device. The third rail 30 is fixedly connected to the second support rail 28, preferably through at least one connecting member 25 such that the longitudinal axis of the third rail 30 differs from that of the second support rail 28. The third support rail 32 can be longitudinally displaced with respect to the third rail 30. The third rail 30 and the third support rail 32 jointly form a second slide rail device.

The slide rail assembly 20 in FIG. 1 is in a retracted state, in which the second rail 24 is at a first retracted position R1 with respect to the first rail 22 and the third support rail 32 is at a second retracted position R2 with respect to the third rail 30.

FIG. 4 shows the slide rail assembly 20 in an extended state, with the second support rail 28 at a first extended position E1 with respect to the first rail 22, the second rail 24 at a second extended position E2 with respect to the first rail 22 (or the second support rail 28), and the third support rail 32 at a third extended position E3 with respect to the third rail 30.

Figure 5:
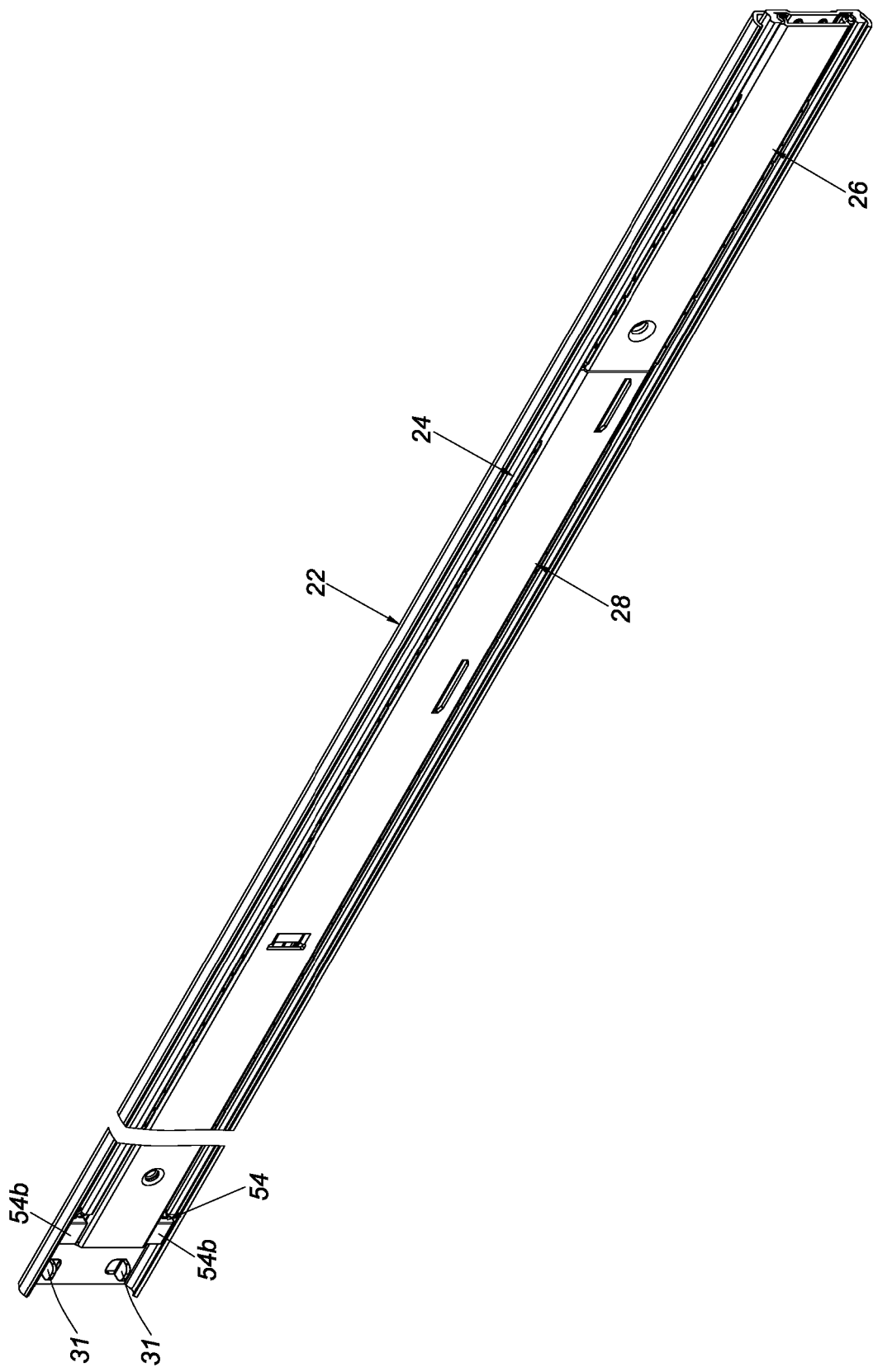
FIG. 5 is a perspective view of the first slide rail device of the slide rail assembly according to the embodiment of the present invention, wherein the first slide rail device is in a retracted state, the first slide rail device being formed by the first rail, the second rail, the first support rail, and the second support of the slide rail assembly.
Figure 6:
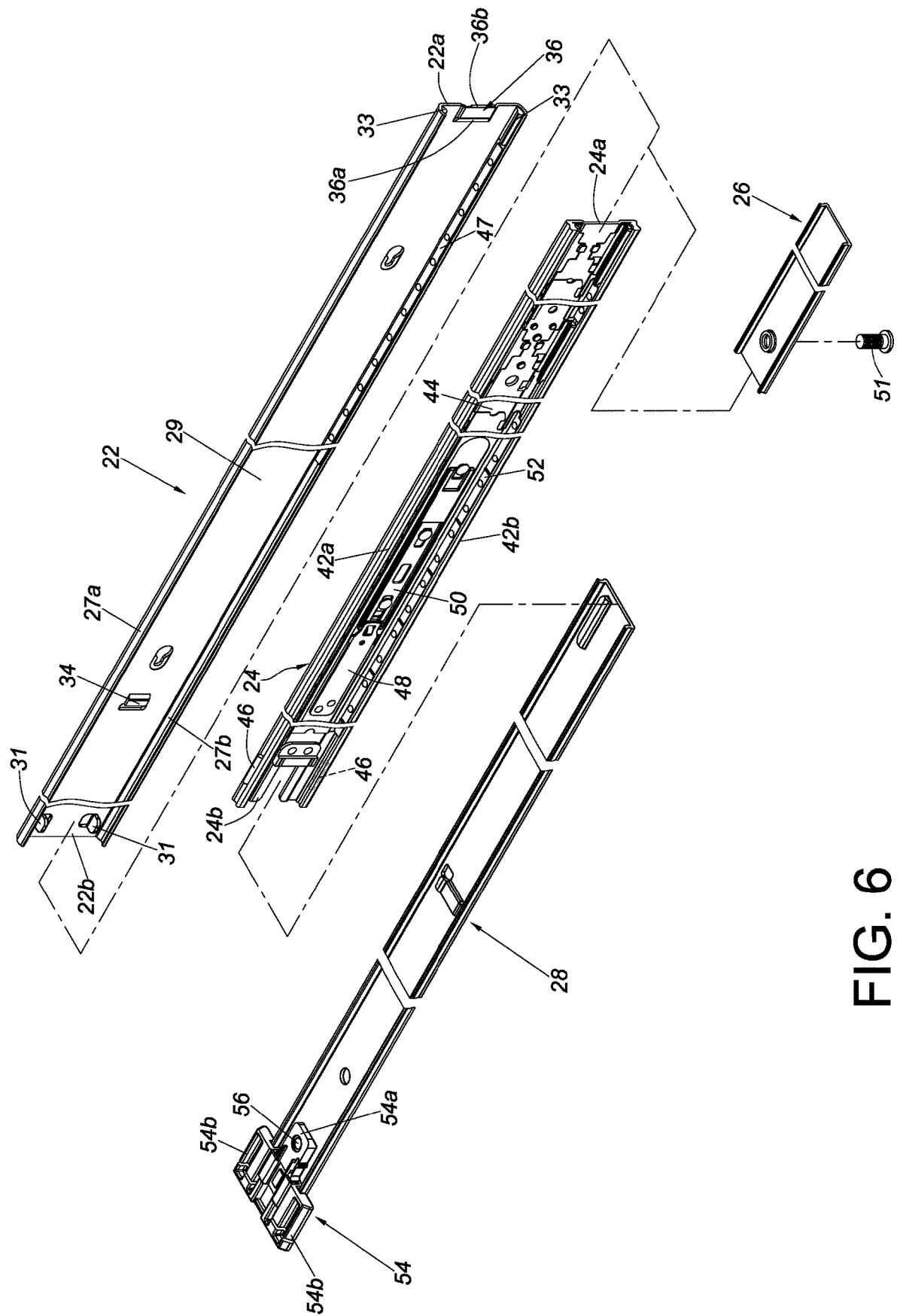
FIG. 6 is an exploded perspective view of the first slide rail device of the slide rail assembly according to the embodiment of the present invention.

As shown in FIG. 5 and FIG. 6, the first rail 22 has a front end 22a and a rear end 22b. The first rail 22 includes a first wall 27a, a second wall 27b, and a longitudinal wall 29 connected between the first wall 27a and the second wall 27b of the first rail 22. The first wall 27a, the second wall 27b, and the longitudinal wall 29 jointly define a first channel.

Preferably, the first rail 22 further includes a rear blocking structure 31 and a front blocking structure 33. The rear blocking structure 31 is adjacent to the rear end 22b of the first rail 22, and the front blocking structure 33 is adjacent to the front end 22a of the first rail 22. Here, and by way of example only, the rear blocking structure 31 is at least one projection on the longitudinal wall 29 and lies in the first channel, and the front blocking structure 33 is at least one projection on the first wall 27a and/or the second wall 27b and lies in the first channel too.

Preferably, a limiting feature 34 is disposed on the first rail 22 at a position between the front end 22a and the rear end 22b of the first rail 22. Here, the limiting feature 34 is a projection between the front end 22a and the rear blocking structure 31.

Preferably, a guiding structure 36 is disposed on the first rail 22 at a position adjacent to the front end 22a of the first rail 22. Here, the guiding structure 36 is located on the longitudinal wall 29 and lies in the first channel by way of example. The guiding structure 36 includes a guide surface 36a and an extension section 36b adjacent to the guide surface 36a. The guide surface 36a is an inclined or curved surface. The extension section 36b extends to the front end 22a of the first rail 22.

The second rail 24 is movably connected to the first rail 22. More specifically, the second rail 24 is mounted in the first channel of the first rail 22. The second rail 24 has a front end 24a and a rear end 24b. The second rail 24 includes a first wall 42a, a second wall 42b, and a longitudinal wall 44 connected between the first wall 42a and the second wall 42b of the second rail 24. The first wall 42a, the second wall 42b, and the longitudinal wall 44 jointly define a second channel. The second rail 24 has the aforesaid first and second portions, such as a front section and a rear section.

Preferably, the first wall 42a and the second wall 42b of the second rail 24 have at least one contact portion 46. When the second rail 24 is at the second extended position E2 with respect to the first rail 22, the contact portion 46 of the second rail 24 presses against a ball-based slide-assisting device 47 provided between the first rail 22 and the second rail 24, and the ball-based slide-assisting device 47 is held against the front blocking structure 33 of the first rail 22 as a result, preventing the second rail 24 from being displaced from the second extended position E2 in an opening direction.

Figure 7:
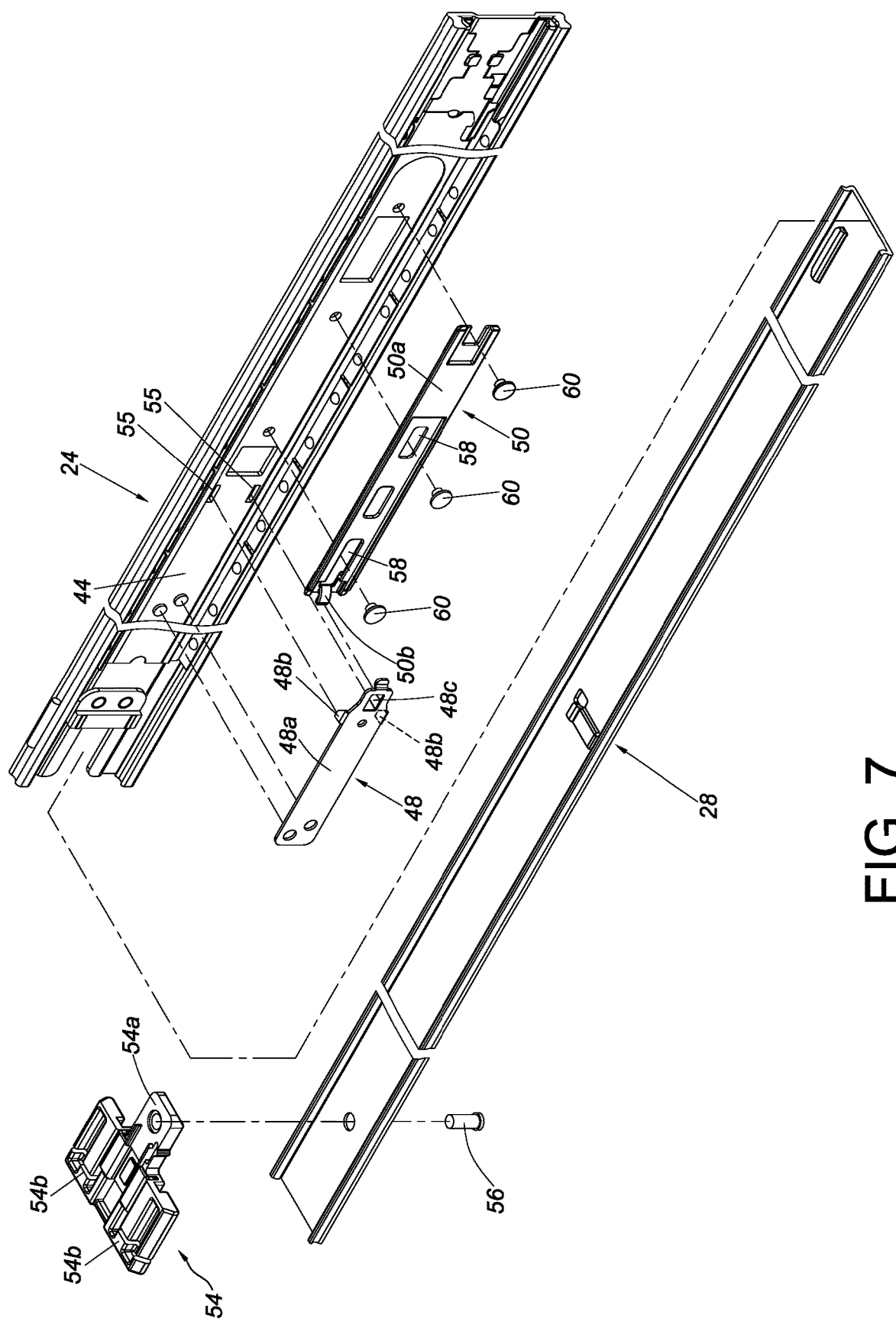
FIG. 7 is an exploded perspective view of the second rail, the second support rail, and the related slide rail components according to the embodiment of the present invention.

Preferably, the slide rail assembly 20 further includes an engaging member 48 and an operating member 50 as shown in FIG. 7. The engaging member 48 is disposed on the second rail 24. The operating member 50 is connected to the engaging member 48 in an operable manner.

Referring back to FIG. 6, the first support rail 26 is fixedly connected to the front section of the second rail 24. For example, the first support rail 26 may be connected to the second rail 24 by threaded connection, riveting, soldering, or mechanical engagement. Here, the first support rail 26 is connected to the longitudinal wall 44 of the second rail 24 by a threaded connecting member 51 and lies in the second channel by way of example.

The second support rail 28 is movably connected to the rear section of the second rail 24 and lies also in the second channel. Preferably, the slide rail assembly 20 includes another ball-based slide-assisting device 52, which is provided between, and in slidable contact with, the second rail 24 and the second support rail 28.

Preferably, a corresponding feature 54 is disposed on the second support rail 28 and is configured to work with the limiting feature 34 of the first rail 22. The corresponding feature 54 may be formed directly on the second support rail 28 or, as in this embodiment by way of example, be an additional component attached to the second support rail 28.

As shown in FIG. 7, the second support rail 28 is mounted on the rear section of the second rail 24 and is in the second channel of the second rail 24 (please note that the first support rail 26 is not shown in FIG. 7). The corresponding feature 54 is an additional component connected to the second support rail 28 via a fixing member 56 and is adjacent to the rear end of the second support rail 28. The corresponding feature 54 includes an abutting portion 54a and a pair of supporting portions 54b connected to the abutting portion 54a. The pair of supporting portions 54b are configured to support the first wall 27a and the second wall 27b of the first rail 22 respectively.

The engaging member 48 is, for example, an elastic plate or a flexible element. The engaging member 48 includes an elastic arm 48a and at least one engaging portion 48b disposed on the elastic arm 48a. The at least one engaging portion 48b extends through at least one hole 55 in the second rail 24 and faces the first rail 22 in response to the elastic force of the elastic arm 48a. The operating member 50 is disposed on (e.g., movably connected to) the second rail 24. Here, and by way of example only, the operating member 50 has at least one longitudinal slot 58 (or slit), is connected to the second rail 24 by at least one mounting member 60 extending through a portion of the at least one longitudinal slot 58, and can therefore be longitudinally displaced with respect to the second rail 24. More specifically, the operating member 50 has a longitudinal body 50a and a driving portion 50b connected to the longitudinal body 50a. The longitudinal body 50a has the at least one longitudinal slot 58. The driving portion 50b is raised at an angle with respect to the longitudinal body 50a and extends through a through hole 48c in the elastic arm 48a of the engaging member 48 so as to drive the elastic arm 48a.

Figure 8:
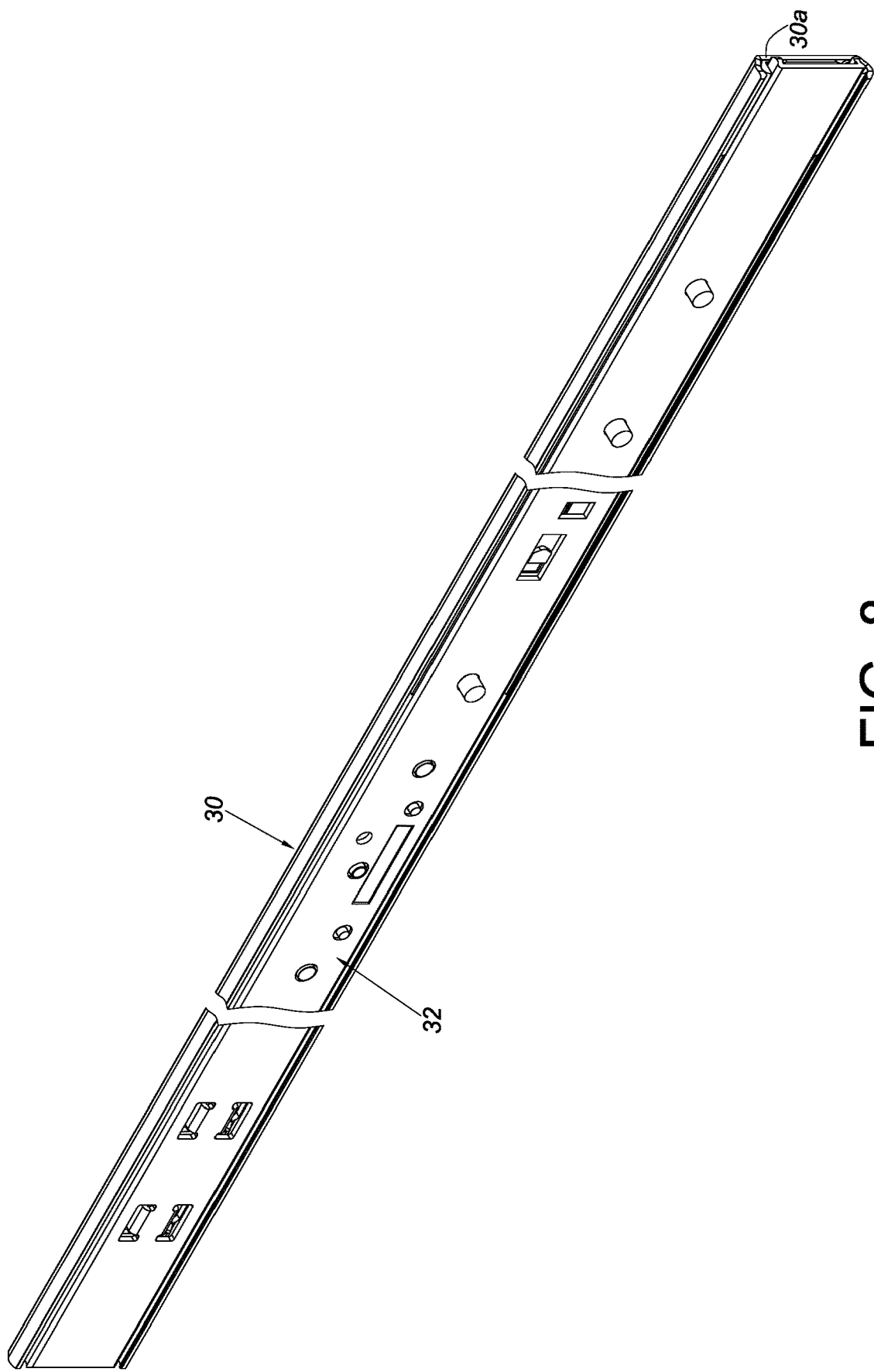
FIG. 8 is a perspective view of the second slide rail device of the slide rail assembly according to the embodiment of the present invention, wherein the second slide rail device is in a retracted state, the second slide rail device being formed by the third rail and the third support rail of the slide rail assembly.
Figure 9:
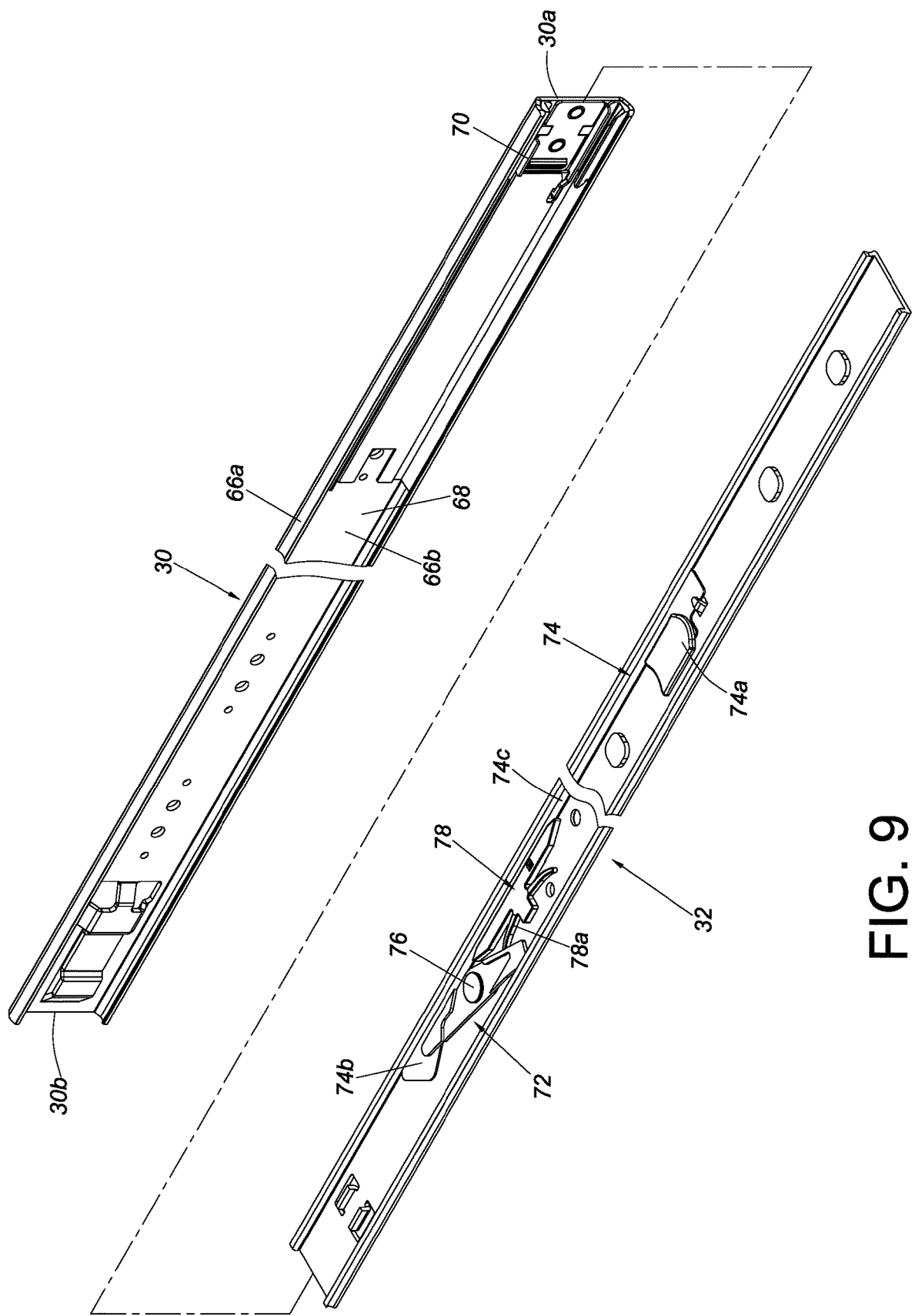
FIG. 9 is an exploded perspective view of the second slide rail device of the slide rail assembly according to the embodiment of the present invention.

Referring to FIG. 8 and FIG. 9, the third rail 30 has a front end 30a and a rear end 30b. The third rail 30 includes a first wall 66a, a second wall 66b, and a longitudinal wall 68 connected between the first wall 66a and the second wall 66b of the third rail 30. The first wall 66a, the second wall 66b, and the longitudinal wall 68 jointly define a third channel. Preferably, the third rail 30 includes a blocking portion 70 adjacent to the front end 30a of the third rail 30 and lying in the third channel. Here, the blocking portion 70 protrudes from, and in a transverse direction with respect to, the longitudinal wall 68 of the third rail 30 by way of example.

The third support rail 32 is movably connected to the third rail 30. More specifically, the third support rail 32 is mounted in the third channel of the third rail 30. Preferably, the slide rail assembly 20 further includes a working member 72 and a release member 74 operably connected to the working member 72. The working member 72 is movably disposed on the third support rail 32. Here, the working member 72 is pivotally connected to the third support rail 32 via a shaft member 76 by way of example. Preferably, a base 78 is disposed on the third support rail 32 and includes an elastic portion 78a for applying an elastic force to the working member 72 and thereby keeping the working member 72 in a first state. The release member 74 includes a release portion 74a, a driving section 74b, and a longitudinal portion 74c connected between the release portion 74a and the driving section 74b.

FIG. 10 shows the slide rail assembly 20 in the retracted state, in which, as stated above with reference to FIG. 1, the second rail 24 is at the first retracted position R1 with respect to the first rail 22 and the third support rail 32 is at the second retracted position R2 with respect to the third rail 30.

While the second rail 24 is at the first retracted position R1 with respect to the first rail 22 as shown in FIG. 10, the rear end 24b of the second rail 24 abuts against the rear blocking structure 31 of the first rail 22 through the pair of supporting portions 54b of the corresponding feature 54 of the second support rail 28, the abutting portion 54a of the corresponding feature 54 is spaced apart from the limiting feature 34 of the first rail 22, and the at least one engaging portion 48b of the engaging member 48 is spaced apart from the guiding structure 36 at the front end 22a of the first rail 22, with the operating member 50 operably connected to the engaging member 48 as stated above, and with the at least one engaging portion 48b of the engaging member 48 extending through the at least one hole 55 of the second rail 24 as stated above (see FIG. 11).

Moreover, in the retracted state shown in FIG. 10, the working member 72 (which is disposed on the third support rail 32) stays in the first state in response to the elastic force applied by the elastic portion 78a of the base 78 and is spaced apart from the blocking portion 70 of the third rail 30, with the release member 74 operably connected to the working member 72 as stated above, and with the third rail 30 fixedly connected to the second support rail 28 via the at least one connecting member 25 and therefore having a longitudinal axis different from that of the second support rail 28 as stated above.

Referring to FIG. 12, when the second rail 24 is displaced with respect to the first rail 22 from the first retracted position R1 to the first extended position E1 in the opening direction D1, the second support rail 28 is carried by the second rail 24 to the first extended position E1 too (the first extended position E1 in FIG. 12 being schematically marked at the front end of the second support rail 28). Once arriving at the first extended position E1, the second support rail 28 abuts against the limiting feature 34 of the first rail 22 through the abutting portion 54a of the corresponding feature 54 (see FIG. 13) and is thereby kept at the first extended position E1 with respect to the first rail 22. The third rail 30 in this state is also brought to the first extended position E1 by the second support rail 28.

Referring to FIG. 14, when the second rail 24 is displaced from the first extended position E1 with respect to the first rail 22 (or the second support rail 28, which is kept at the first extended position E1 with respect to the first rail 22) in the opening direction D1, the engaging portion 48b of the engaging member 48 is brought into slidable contact with the guiding structure 36 (or more particularly the guide surface 36a) at the front end 22a of the first rail 22 (see FIG. 15). Consequently, the elastic arm 48a of the engaging member 48 is pivoted by an angle and accumulates an elastic force.

Figure 18:
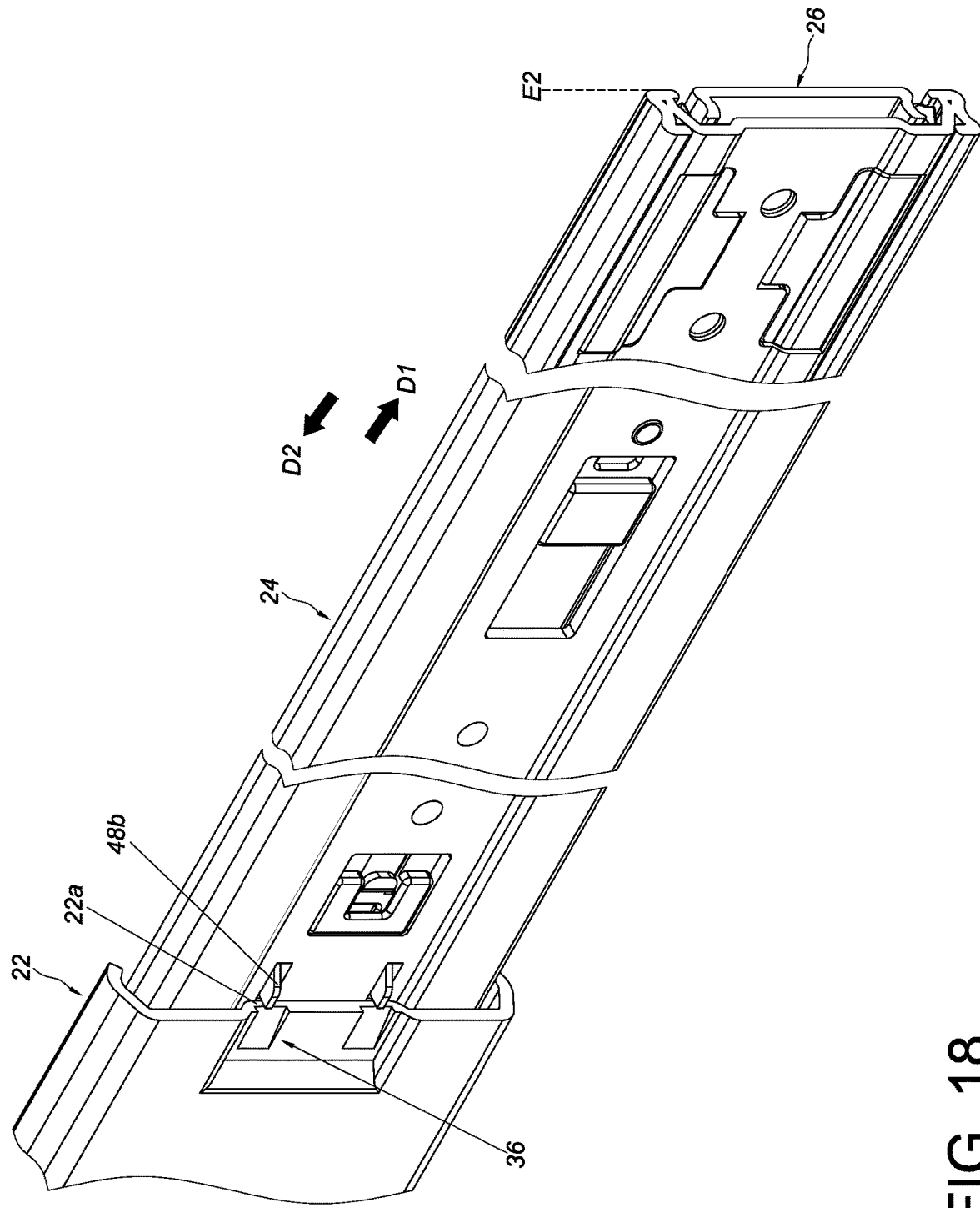
FIG. 18 is a perspective view showing the first slide rail device of the slide rail assembly in the second extended state according to the embodiment of the present invention.

Referring to FIG. 16, when the second rail 24 is further displaced with respect to the first rail 22 (or the second support rail 28) in the opening direction D1 and reaches the second extended position E2, the rear end 26b of the first support rail 26 is spaced apart from the front end 28a of the second support rail 28 by a predetermined distance, and the engaging portion 48b of the engaging member 48 engages with the front end 22a of the first rail 22 (see FIG. 17 and FIG. 18) in response to the elastic arm 48a releasing the accumulated elastic force, thereby preventing the second rail 24 from being displaced from the second extended position E2 in a retracting direction D2 (i.e., the opposite direction of the opening direction D1). As shown in FIG. 16, the front end 32a of the third support rail 32 extends beyond the front end 28a of the second support rail 28 by a first extension distance Y1 when the second support rail 28 is kept at the first extended position E1 and the third support rail 32 is at the second retracted position R2 with respect to the third rail 30.

In FIG. 19, the third support rail 32 is displaced with respect to the third rail 30 from the second retracted position R2 to the third extended position E3 in the opening direction D1 while the second support rail 28 is at the first extended position E1 with respect to the first rail 22 and the second rail 24 is at the second extended position E2 with respect to the first rail 22 (or the second support rail 28) (see also FIG. 4). In this state, the front end 32a of the third support rail 32 extends beyond the front end 28a of the second support rail 28 by a second extension distance Y2, wherein the second extension distance Y2 is greater than the first extension distance Y1. Preferably, the working member 72 is in the first state K1 and abuts against the blocking portion 70 of the third rail 30 when the third support rail 32 is at the third extended position E3 with respect to the third rail 30, the objective being to prevent the third support rail 32 from being displaced from the third extended position E3 in the opening direction D1.

Referring to FIG. 20, the working member 72 is operated and thus brought from the first state K1 into a second state K2, in which the working member 72 no longer abuts against the blocking portion 70. The third support rail 32 is therefore allowed to be displaced from the third extended position E3 in the opening direction D1 and eventually separate from the third rail 30. Preferably, the working member 72 is configured to be driven by the release member 74 so that when a user applies a force F1 to the release member 74, the driving section 74b of the release member 74 will pivot the working member 72 and thereby bring the working member 72 from the first state K1 into the second state K2, in which the working member 72 no longer abuts against the blocking portion 70 of the third rail 30.

Figure 21:
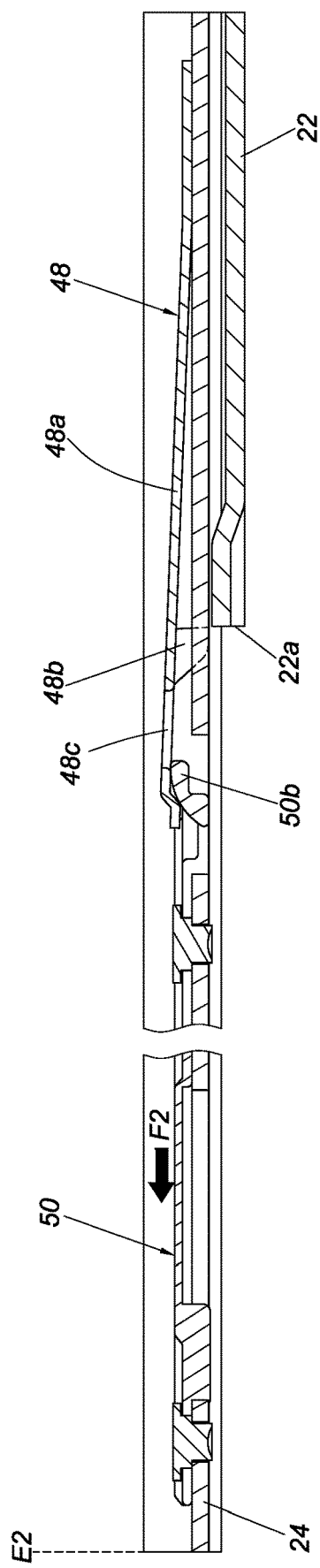
FIG. 21 is a schematic view showing that the engaging member is disengaged from the first rail and that, therefore, the first slide rail device is no longer in the second extended state according to the embodiment of the present invention.

Referring to FIG. 21, while the second rail 24 is at the second extended position E2 with respect to the first rail 22 (or the second support rail 28) due to engagement between the engaging portion 48b of the engaging member 48 and the front end 22a of the first rail 22, a user can apply another force F2 to the operating member 50 in order for the driving portion 50b of the operating member 50 to pivot the elastic arm 48a of the engaging member 48 by an angle and thereby disengage the engaging portion 48b from the first rail 22. For example, the operating member 50 is longitudinally displaced along the second rail 24 through the longitudinal slot 58 such that the driving portion 50b is moved away from the through hole 48c of the elastic arm 48a and pressed against the elastic arm 48a to disengage the engaging portion 48b from the front end 22a of the first rail 22. Once the engaging portion 48b is disengaged from the front end 22a of the first rail 22, the second rail 24 can be retracted with respect to the first rail 22 from the second extended position E2 in the retracting direction D2. As the second support rail 28 is disposed in the second channel of the second rail 24, retracting the second rail 24 with respect to the first rail 22 will also retract the second support rail 28 with respect to the first rail 22.

Figure 22:
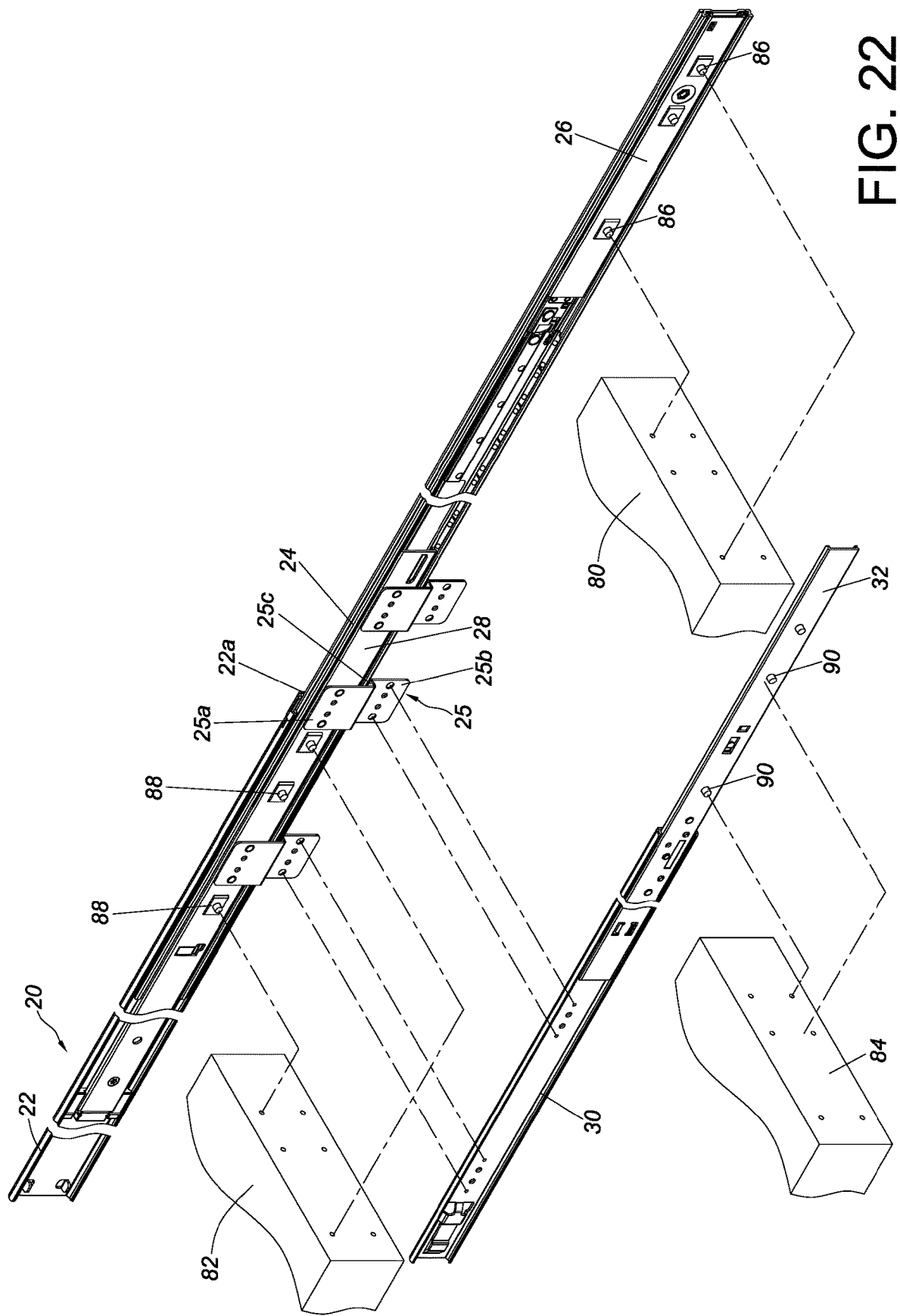
FIG. 22 is a schematic view showing that the slide rail of the slide rail assembly can be used to carry a plurality of objects according to the embodiment of the present invention.

Referring to FIG. 22, the third rail 30 is fixedly connected to the second support rail 28 by the at least one connecting member 25, e.g., three connecting members 25. Preferably, the connecting member 25 includes a first portion 25a, a second portion 25b, and a middle portion 25c connected between the first portion 25a and the second portion 25b, wherein the first portion 25a and the second portion 25b are substantially perpendicularly connected to two opposite ends of the middle portion 25c respectively and extend in opposite directions respectively. It is preferable that the first portion 25a is fixedly connected to the second support rail 28 while the second portion 25b is fixedly connected to the rear side of the longitudinal wall 68 of the third rail 30 (i.e., the opposite side of the third channel of the third rail 30).

The slide rail assembly 20 can be used to carry a first object 80, a second object 82, and a third object 84. The objects 80, 82, and 84 may be electronic equipment but are not necessarily so in practice.

The first object 80 is disposed on the first support rail 26, the second object 82 is disposed on the second support rail 28, and the third object 84 is disposed on the third support rail 32. More specifically, the first support rail 26, the second support rail 28, and the third support rail 32 are respectively provided with a plurality of longitudinally arranged first mounting portions 86, a plurality of longitudinally arranged second mounting portions 88, and a plurality of longitudinally arranged third mounting portions 90. The first object 80, the second object 82, and the third object 84 can be mounted on the first mounting portions 86, the second mounting portions 88, and the third mounting portions 90 respectively in a detachable manner.

Figure 23:
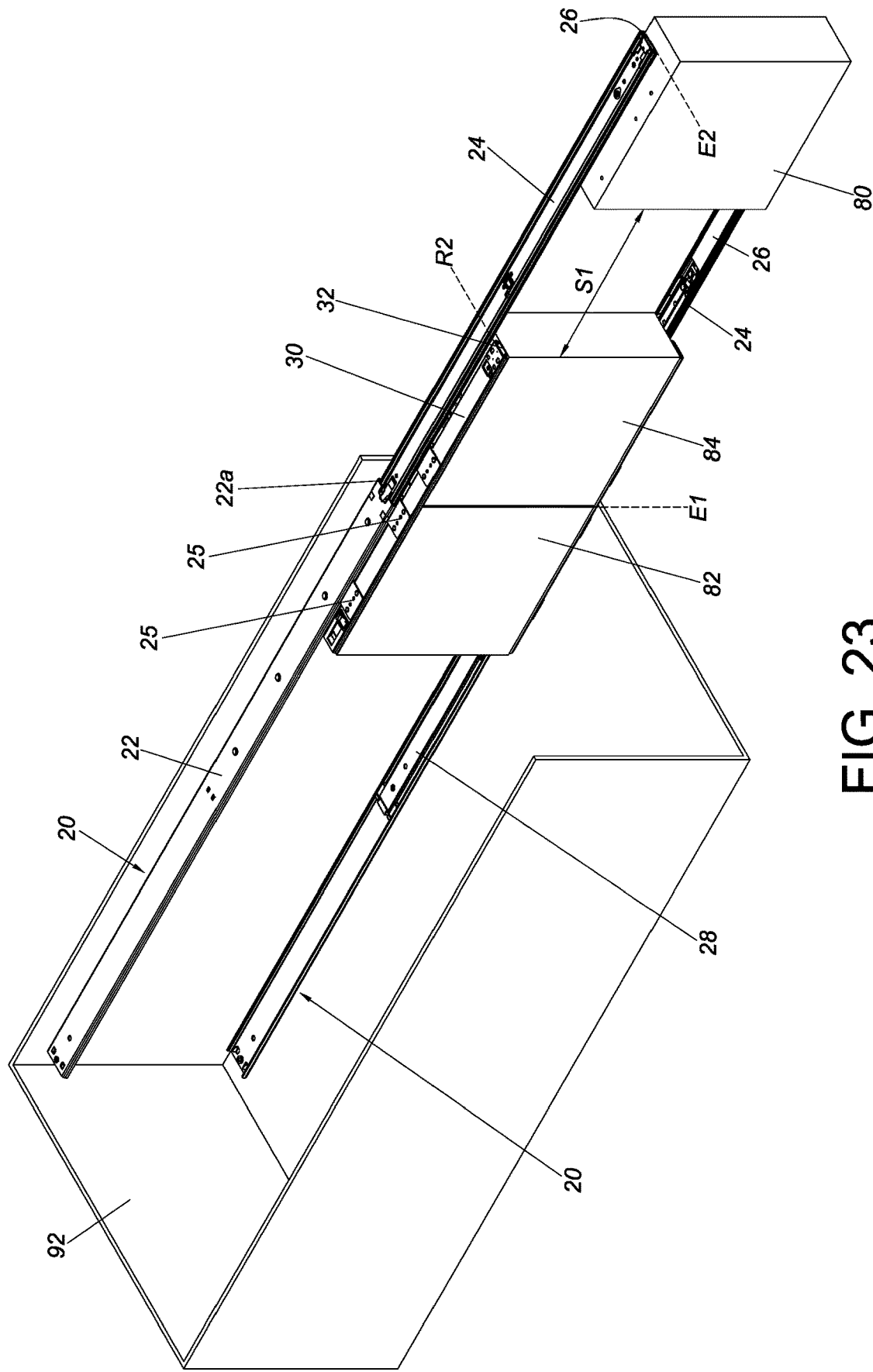
FIG. 23 shows a first state of use of a pair of slide rail assemblies according to the embodiment of the present invention, wherein the slide rail assemblies are applied to an article in order for the slide rails of the slide rail assemblies to carry a plurality of objects.

Referring to FIG. 23, the objects 80, 82, and 84 are mounted on an article 92 (e.g., a cabinet body or rack) through a pair of slide rail assemblies 20.

More specifically, the first rail 22 of each slide rail assembly 20 is mounted on the article 92. When each second rail 24 is at the second extended position E2 with respective to the corresponding first rail 22 and each third support rail 32 is at the second retracted position R2 with respect to the corresponding third rail 30, each first support rail 26 lies entirely in front of the front end 22a of the corresponding first rail 22 (see also FIG. 16), and the first object 80 and the third object 84 define a first space S1 therebetween. The first space S1 makes it easier for a user to perform maintenance work on the first object 80, the third object 84, or the related slide rail components.

Figure 24:
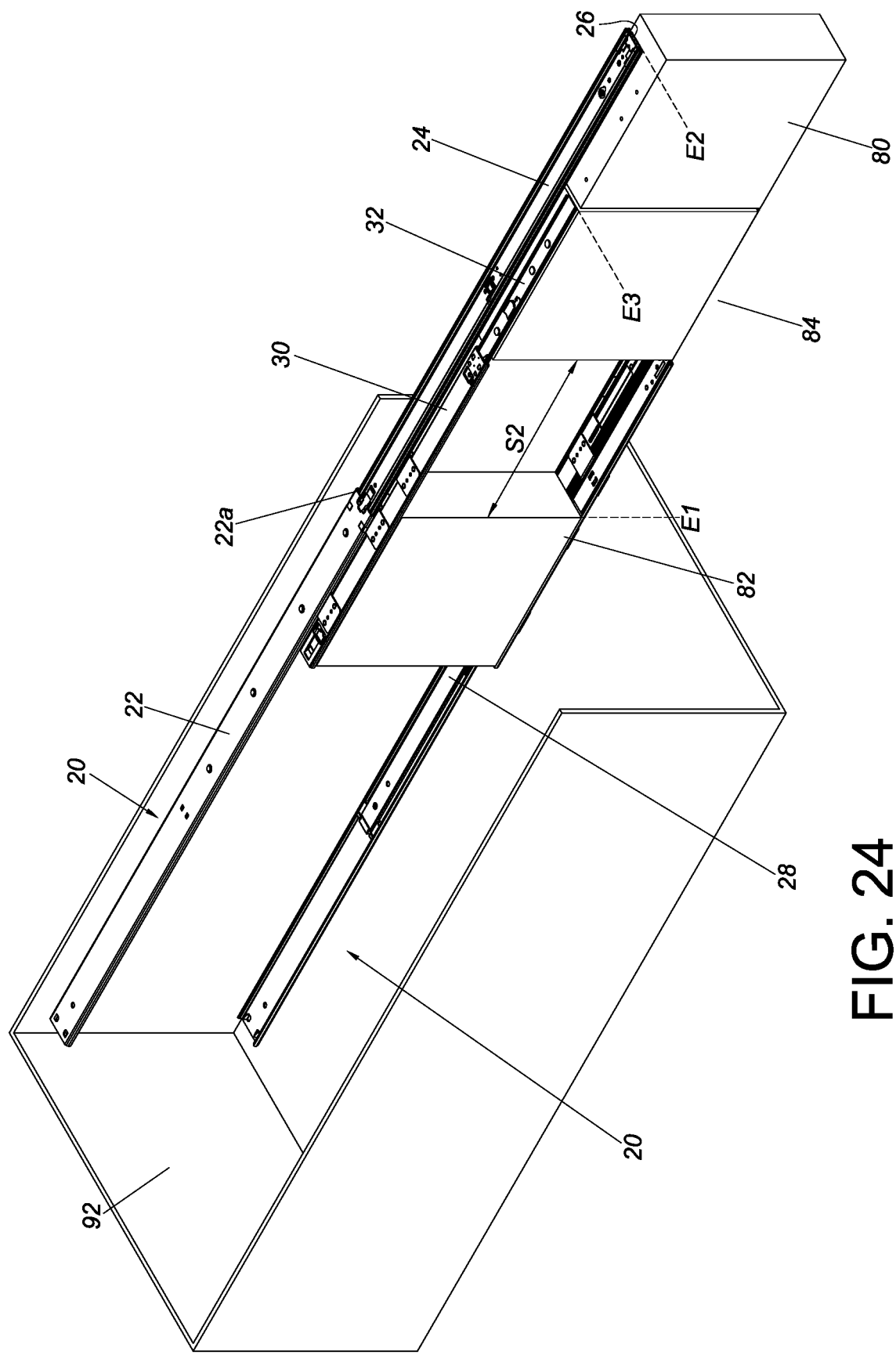
FIG. 24 shows a second state of use of the slide rail assemblies according to the embodiment of the present invention, wherein the slide rail assemblies are applied to an article in order for the slide rails of the slide rail assemblies to carry a plurality of objects.

Referring to FIG. 24, when each second rail 24 is at the second extended position E2 with respect to the corresponding first rail 22 and each third support rail 32 is at the third extended position E3 with respect to the corresponding third rail 30, each third support rail 32 lies entirely in front of the front end 22a of the corresponding first rail 22 (see also FIG. 19), and the third object 84 and the second object 82 define a second space S2 therebetween. The second space S2 makes it easier for a user to perform maintenance work on the second object 82, the third object 84, or the related slide rail components.

It can be known from the above that the slide rail assembly disclosed in the foregoing embodiment preferably has the following features:

1. The slide rails of the slide rail assembly 20 are arranged in a novel manner in relation to one another. For example, the slide rail assembly 20 includes the first rail 22, the second rail 24, the first support rail 26, the second support rail 28, the third rail 30, and the third support rail 32, wherein: the second rail 24 is movably connected to the first rail 22, the first support rail 26 is fixedly connected to the second rail 24, the second support rail 28 is movably connected to the second rail 24, the third rail 30 is fixedly connected to the second support rail 28, and the third support rail 32 is movably connected to the third rail 30.
2. The third rail 30 is fixedly connected to the second support rail 28 by the at least one connecting member 25 such that the third rail 30 and the second support rail 28 extend along different longitudinal axes respectively.
3. When the second support rail 28 is at the first extended position E1 and the third support rail 32 is at the second retracted position R2 with respect to the third rail 30, the front end 32a of the third support rail 32 extends beyond the front end 28a of the second support rail 28 by the first extension distance Y1; and when the second support rail 28 is at the first extended position E1 and the third support rail 32 is at the third extended position E3 with respect to the third rail 30, the front end 32a of the third support rail 32 extends beyond the front end 28a of the second support rail 28 by the second extension distance Y2, wherein the second extension distance Y2 is greater than the first extension distance Y1.
4. When the second rail 24 is at the second extended position E2 and the third support rail 32 is at the second retracted position R2, the entire first support rail 26 lies ahead of the front end 22a of the first rail 22, and the first space S1 is defined between the first object 80 and the third object 84 to facilitate maintenance of the objects or the related slide rail components. When the second rail 24 is at the second extended position E2 and the third support rail 32 is at the third extended position E3, the entire third support rail 32 lies ahead of the front end 22a of the first rail 22, and the second space S2 is defined between the third object 84 and the second object 82 to facilitate maintenance of the objects or the related slide rail components.
5. The second support rail 28 and the third rail 30 are connected by the at least one connecting member 25, which includes the first portion 25a, the second portion 25b, and the middle portion 25c connected between the first portion 25a and the second portion 25b. The first portion 25a and the second portion 25b are substantially perpendicularly connected to the middle portion 25c and extend in different directions respectively. The first portion 25a is fixedly connected to the second support rail 28, and the second portion 25b is fixedly connected to the third rail 30. According to this configuration, the third rail 30 and the second support rail 28 extend along different longitudinal axes respectively, and this allows the third rail 30 to be provided with the third support rail 32 for carrying the third object 84.

While the present invention has been disclosed through the preferred embodiment described above, the embodiment is not intended to be restrictive of the scope of the invention. The scope of patent protection sought by the applicant is defined by the appended claims.

What is claimed is:

1. A slide rail assembly, comprising:
   a first rail provided with a limiting feature between a front end and a rear end of the first rail;
   a second rail movably connected to the first rail, wherein the second rail has a first portion and a second portion;
   a first support rail fixedly connected to the first portion of the second rail;
   a second support rail movably connected to the second portion of the second rail, the second support rail being provided with a corresponding feature;
   a third rail fixedly connected to the second support rail; and
   a third support rail movably connected to the third rail,
   wherein, when the second rail reaches a first extended position after displacement with respect to the first rail from a first retracted position in an opening direction, the second support rail abuts against the limiting feature through the corresponding feature and is thus kept at the first extended position with respect to the first rail,
   wherein, when the second rail reaches a second extended position after displacement from the first extended position in the opening direction, there is a predetermined distance between a rear end of the first support rail and a front end of the second support rail, and wherein, when the second support rail is kept at the first extended position and the third support rail is at a second retracted position with respect to the third rail, a front end of the third support rail extends beyond the front end of the second support rail by a first extension distance.

2. The slide rail assembly of claim 1, further comprising an engaging member disposed on the second rail such that, when at the second extended position with respect to the first rail, the second rail is engaged with the first rail through the engaging member and is thus kept from displacement from the second extended position in a retracting direction.

3. The slide rail assembly of claim 2, further comprising an operating member disposed on the second rail, wherein the operating member is configured to drive the engaging member out of engagement with the first rail.

4. The slide rail assembly of claim 1, wherein when the second support rail is kept at the first extended position and the third support rail reaches a third extended position after displacement with respect to the third rail from the second retracted position in the opening direction, the front end of the third support rail extends beyond the front end of the second support rail by a second extension distance greater than the first extension distance.

5. The slide rail assembly of claim 4, wherein the third rail includes a blocking portion, a working member is movably disposed on the third support rail, and when the third support rail is at the third extended position with respect to the third rail, the working member is in a first state and abuts against the blocking portion to prevent the third support rail from displacement from the third extended position in the opening direction.

6. The slide rail assembly of claim 5, wherein the working member no longer abuts against the blocking portion once brought into a second state from the first state by operation.

7. The slide rail assembly of claim 1, wherein the third rail is fixedly connected to the second support rail through at least one connecting member.

8. The slide rail assembly of claim 4, wherein the first support rail is configured to carry a first object, the second support rail is configured to carry a second object, and the third support rail is configured to carry a third object such that when the second rail is at the second extended position and the third support rail is at the second retracted position, the entire first support rail is in front of the front end of the first rail, with the first object and the third object defining a first space therebetween.

9. The slide rail assembly of claim 8, wherein when the second rail is at the second extended position and the third support rail is at the third extended position, the entire third support rail is in front of the front end of the first rail, with the third object and the second object defining a second space therebetween.

10. A slide rail assembly, comprising:
a first rail provided with a limiting feature between a front end and a rear end of the first rail;
a second rail longitudinally displaceable with respect to the first rail;
a first support rail fixedly connected to a front section of the second rail;
a second support rail movably connected to a rear section of the second rail, the second support rail being provided with a corresponding feature;
a third rail;
a connecting member for connecting the second support rail and the third rail; and
a third support rail longitudinally displaceable with respect to the third rail,
wherein, when the second rail reaches a first extended position after displacement with respect to the first rail from a first retracted position in an opening direction, the second support rail abuts against the limiting feature through the corresponding feature and is thus kept at the first extended position with respect to the first rail,
wherein when the second rail reaches a second extended position after displacement from the first extended position in the opening direction, there is a predetermined distance between a rear end of the first support rail and a front end of the second support rail, and
wherein, when the second support rail is kept at the first extended position and the third support rail is at a second retracted position with respect to the third rail, a front end of the third support rail extends beyond the front end of the second support rail by a first extension distance.

11. The slide rail assembly of claim 10, further comprising an engaging member disposed on the second rail such that, when at the second extended position with respect to the first rail, the second rail is engaged with the first rail through the engaging member and is thus kept from displacement from the second extended position in a retracting direction.

12. The slide rail assembly of claim 10, wherein when the second support rail is kept at the first extended position and the third support rail reaches a third extended position after displacement with respect to the third rail from the second retracted position in the opening direction, the front end of the third support rail extends beyond the front end of the second support rail by a second extension distance greater than the first extension distance.

13. The slide rail assembly of claim 12, wherein the first support rail is configured to carry a first object, the second support rail is configured to carry a second object, and the third support rail is configured to carry a third object such that when the second rail is at the second extended position and the third support rail is at the second retracted position, the entire first support rail is in front of the front end of the first rail, with the first object and the third object defining a first space therebetween; and wherein when the second rail is at the second extended position and the third support rail is at the third extended position, the entire third support rail is in front of the front end of the first rail, with the third object and the second object defining a second space therebetween.

14. The slide rail assembly of claim 10, wherein the connecting member includes a first portion, a second portion, and a middle portion connected between the first portion and the second portion, the first portion and the second portion are substantially perpendicularly connected to the middle portion and extend in different directions respectively, the first portion is fixedly connected to the second support rail, and the second portion is fixedly connected to the third rail.

* * * * *